(12) United States Patent
Hondo (10) Patent No.: US 8,502,086 B2
(45) Date of Patent: Aug. 6, 2013

(54) LAMINATED WIRING BOARD AND METHOD FOR MANUFACTURING THE SAME

(75) Inventor: Takaharu Hondo, Sakura (JP)

(73) Assignee: Fujikura Ltd., Tokyo (JP)

( * ) Notice: Subject to any disclaimer, the term of this patent is extended or adjusted under 35 U.S.C. 154(b) by 438 days.

(21) Appl. No.: 12/600,444

(22) PCT Filed: May 14, 2008

(86) PCT No.: PCT/JP2008/058867
§ 371 (c)(1),
(2), (4) Date: Nov. 16, 2009

(87) PCT Pub. No.: WO2008/143099
PCT Pub. Date: Nov. 27, 2008

(65) Prior Publication Data
US 2010/0147576 A1   Jun. 17, 2010

(30) Foreign Application Priority Data
May 17, 2007   (JP) ................. 2007-131324

(51) Int. Cl.
*H05K 1/11* (2006.01)
*H05K 3/10* (2006.01)

(52) U.S. Cl.
USPC ............. 174/266; 174/261; 174/262; 29/830; 29/846; 29/852

(58) Field of Classification Search
USPC .... 174/250, 256, 259, 261–263, 266; 216/18; 29/830, 846, 852
See application file for complete search history.

(56) References Cited

U.S. PATENT DOCUMENTS

| | | | | |
|---|---|---|---|---|
| 6,117,706 A | * | 9/2000 | Yoshioka et al. | 438/106 |
| 6,413,620 B1 | * | 7/2002 | Kimura et al. | 428/210 |
| 6,623,844 B2 | * | 9/2003 | Nishimoto | 428/209 |
| 6,689,641 B2 | * | 2/2004 | Ohta et al. | 438/121 |

(Continued)

FOREIGN PATENT DOCUMENTS

| | | |
|---|---|---|
| EP | 1272019 A1 | 1/2003 |
| JP | 2001102754 A | 4/2001 |

(Continued)

OTHER PUBLICATIONS

Extended European Search Report issued Nov. 3, 2011 by the European Patent Office in counterpart Euroepean Patent Application No. 08752738.8.

(Continued)

*Primary Examiner* — Angel R Estrada
*Assistant Examiner* — Dimary Lopez
(74) *Attorney, Agent, or Firm* — Sughrue Mion, PLLC (57) ABSTRACT

Wiring board bases 2 to 4 are provided with: insulating substrates 1a to 4a having conductive layers 1b to 4b provided on one surfaces thereof, respectively; through-holes 2e to 4e which are arranged on the insulating substrates and reach the conductive layers from the other surfaces; and conductive vias 2d to 4d connected to the conductive layers by filling the through-holes with a conductive paste. In a method for manufacturing a laminated wiring board, at least one of the wiring board bases is stacked. Before the through-hole is filled with the conductive paste, a surface portion, in the through-hole, of the conductive layer is smoothed and a smooth surface portion 2g is formed.

7 Claims, 5 Drawing Sheets

U.S. PATENT DOCUMENTS

| | | | |
|---|---|---|---|
| 6,831,235 B1 * | 12/2004 | Enomoto et al. | 174/262 |
| 7,080,446 B2 * | 7/2006 | Baba et al. | 29/832 |
| 7,642,468 B2 * | 1/2010 | Nakada et al. | 174/262 |
| 7,722,962 B2 * | 5/2010 | Soga et al. | 428/620 |
| 7,976,956 B2 * | 7/2011 | Suzuki et al. | 428/609 |
| 2003/0175146 A1 * | 9/2003 | Yeh et al. | 420/560 |
| 2008/0292492 A1 * | 11/2008 | Ingham et al. | 420/561 |

FOREIGN PATENT DOCUMENTS

| | | |
|---|---|---|
| JP | 2003101219 A | 4/2003 |
| JP | 2003133737 A | 5/2003 |
| JP | 2003318546 A | 11/2003 |
| JP | 2004095836 A | 3/2004 |
| JP | 2004179362 A | 6/2004 |
| JP | 2005045187 A | 2/2005 |
| JP | 2005251949 A * | 9/2005 |

OTHER PUBLICATIONS

Chinese Office Action issued in Application No. 200880016458.9, dated Jan. 28, 2011.

* cited by examiner

LAMINATED WIRING BOARD AND METHOD FOR MANUFACTURING THE SAME

TECHNICAL FIELD

The present invention relates to a laminated wiring board and a method for manufacturing the same. More particularly, the present invention relates to a laminated wiring board and a method for manufacturing the same, which are capable of achieving high connection reliability between an interlayer conductive via and a wiring conductive layer in a multilayer wiring board.

BACKGROUND ART

In recent years, with the increasing demand for miniaturization and multi-functionalization of mobile phones, various digital electronic devices and the like, there has also been a strong demand for miniaturization and multi-functionalization of electronic components such as a semiconductor IC element used in those devices and of a printed wiring board on which such components are mounted. In order to meet such a demand, development of various multilayer wiring board technologies has been underway.

A first example of the conventional multilayer wiring board technologies is an EWLP (Embedded Wafer Level Package) technology as disclosed in Patent Document 1. This technology is for forming a package substrate having a multilayer structure by disposing a semiconductor chip, for example, on a support plate and sequentially building up an insulating layer, a metal column for an interlayer via and a wiring metal layer thereon.

Moreover, a second example is a technology as disclosed in Patent Document 2. In the technology, a number of wiring boards are prepared each of which has a wiring conductive layer provided on one surface of an insulating substrate and an adhesive layer provided on the other surface thereof and is provided with a conductive via (through-electrode) made of a conductive paste and serving as an interlayer conductive via. Then, these wiring boards are laminated with the adhesive layers interposed therebetween, and collectively heated and pressure-bonded so as to form a multilayer wiring board.

Patent Document 1: Japanese Patent Application Publication No. 2004-95836
Patent Document 2: Japanese Patent Application Publication No. 2003-318546
Patent Document 3: Japanese Patent Application Publication No. 2001-102754
Patent Document 4: Japanese Patent Application Publication No. 2005-45187

DISCLOSURE OF THE INVENTION

Problems to be Solved by the Invention

The EWLP technology described in the above first example is suitable for achieving ultimate miniaturization. However, the number of steps is increased since a resist mask step, a plating step and a multilayer lamination step are repeated in manufacturing the wiring board. Therefore, execution of the above steps takes a long time, which complicates manufacture. Moreover, a heating step is required for every multilayer lamination step. As a result, many heat histories are applied to some resin layers on the insulating substrate and thus resin deterioration is likely to occur.

Meanwhile, the technology described in the above second example is suitable for reducing complications in the manufacture involving a large number of steps and deterioration of the resin layers on the insulating substrate due to the thermal history as in the case of the first example. However, as shown in the step of FIG. 6(e) in Patent Document 2, in formation of a through-hole 14 by laser processing, for example, surface roughness with large unevenness may be caused on a surface of a conductive layer 12 by a variation in laser beam intensity, and the like in the processing.

When a conductive resin composition (paste) 15 is filled in the through-hole 14 and connected to the conductive layer 12, as in the case of the step of FIG. 6(h) described in Patent Document 2, with such surface roughness, deterioration occurs such that the conductive layer 12 is cracked and broken from a valley floor portion of the unevenness in the case of conducting various resistance tests such as a thermal shock test on the wiring board, for example. This leads to a problem that connection reliability in the connection portion is likely to be reduced.

Moreover, as the tendency of the conventional technology regarding a connection configuration between the conductive layer and the conductive paste, there are many technologies for roughening the conductive layer surface for the purpose of improving adhesion, connection resistance, and the like between the conductive layer and the conductive paste, as can also be seen in Patent Documents 3 and 4. Those technologies have problems caused by unevenness in roughening the conductive layer as in the case of the second example described above. Moreover, it is required to accurately control the surface roughness and uneven shape in active roughening. Therefore, the manufacture is complicated for the reasons described above.

The present invention was made to solve the conventional problems described above. It is an object of the present invention to provide a laminated wiring board and a method for manufacturing the same, which can achieve high connection reliability between an interlayer conductive via and a wiring conductive layer particularly in a multilayer wiring board.

Means for Solving the Problems

A first aspect of the present invention is a method for manufacturing a laminated wiring board in which at least one wiring board base is stacked, the method comprising: providing a conductive layer on a first surface of an insulating substrate included in the wiring board base; providing a through-hole reaching the conductive layer from a second surface opposite to the first surface; smoothing a surface portion, in the through-hole, of the conductive layer; and forming a conductive via to be connected to the conductive layer by filling the through-hole with a conductive paste.

In the method for manufacturing a laminated wiring board according to the first aspect described above, it is preferable that the smoothing is performed in such a manner that an arithmetic mean roughness Ra of the surface portion, in the through-hole, of the conductive layer is 1.0 µm or less.

In the method for manufacturing a laminated wiring board according to the first aspect described above, it is preferable that the smoothing is performed in such a manner that a maximum height roughness Rz of the surface portion, in the through-hole, of the conductive layer is 3 µm or less.

Moreover, in the method for manufacturing a laminated wiring board according to any of the above aspects, the conductive paste may contain a metal component forming an alloy layer between the conductive paste and the conductive layer.

A second aspect of the present invention is a laminated wiring board comprising: at least one wiring board base having an insulating substrate having a first surface and a second surface opposite to the first surface, a conductive layer provided on the first surface and a conductive via including a through-hole reaching the conductive layer from the second surface and a conductive paste filled in the through-hole. In the laminated wiring board, a maximum height roughness Rz of the surface portion, in the through-hole, of the conductive layer is 3 μm or less.

A third aspect of the present invention is a laminated wiring board comprising: at least one wiring board base having an insulating substrate having a first surface and a second surface opposite to the first surface, a conductive layer provided on the first surface and a conductive via including a through-hole reaching the conductive layer from the second surface and a conductive paste filled in the through-hole. In the laminated wiring board, an arithmetic mean roughness Ra of the surface portion, in the through-hole, of the conductive layer is 1.0 μm or less.

Furthermore, in the above laminated wiring board, the conductive paste may contain a metal component forming an alloy layer between the conductive paste and the conductive layer.

A fourth aspect of the present invention is a laminated wiring board comprising: at least one wiring board base having an insulating substrate having a first surface and a second surface opposite to the first surface, a conductive layer provided on the first surface and a conductive via including a through-hole reaching the conductive layer from the second surface and a conductive paste filled in the through-hole. In the laminated wiring board, the conductive paste forms an alloy layer with the conductive layer, a thickness of the alloy layer is 0.5 to 2.0 μm, and the alloy layer contains any of $Cu_3Sn$ and $Cu_6Sn_5$.

In the laminated wiring board and the method for manufacturing the same according to the present invention, the surface portion, in the through-hole, of the conductive layer is smoothed. Therefore, even in various resistance tests such as a thermal shock test on the wiring board, for example, high connection reliability between the conductive layer and the conductive via in the through-hole can be achieved.

Moreover, the wiring board base having the conductive via made of the conductive paste is used. Therefore, the number of steps can be reduced by collectively heating and pressure bonding a plurality of bases including the wiring board base and the like with adhesive layers interposed therebetween. Thus, the laminated wiring board can be easily manufactured without causing resin deterioration due to a thermal history in the insulating substrate.

BEST MODE FOR CARRYING OUT THE INVENTION

Figure 1:
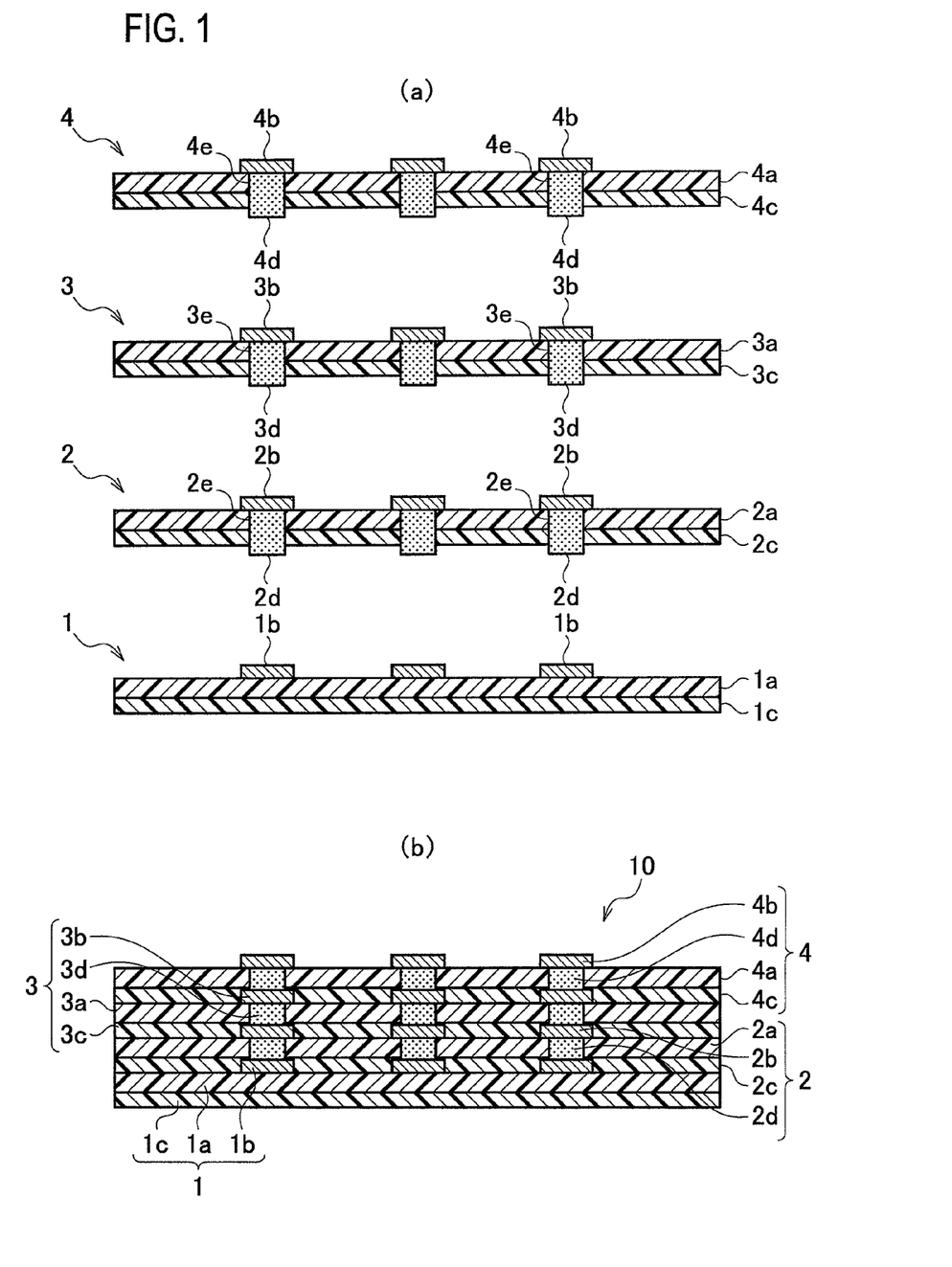
FIGS. 1(a) and 1(b) are schematic cross-sectional views for explaining a method for manufacturing a laminated wiring board by stacking a plurality of wiring board bases according to an embodiment of the present invention, FIG. 1(a) showing each of the wiring board bases before assembly and FIG. 1(b) showing a structure of the laminated wiring board after assembly.
Figure 2:
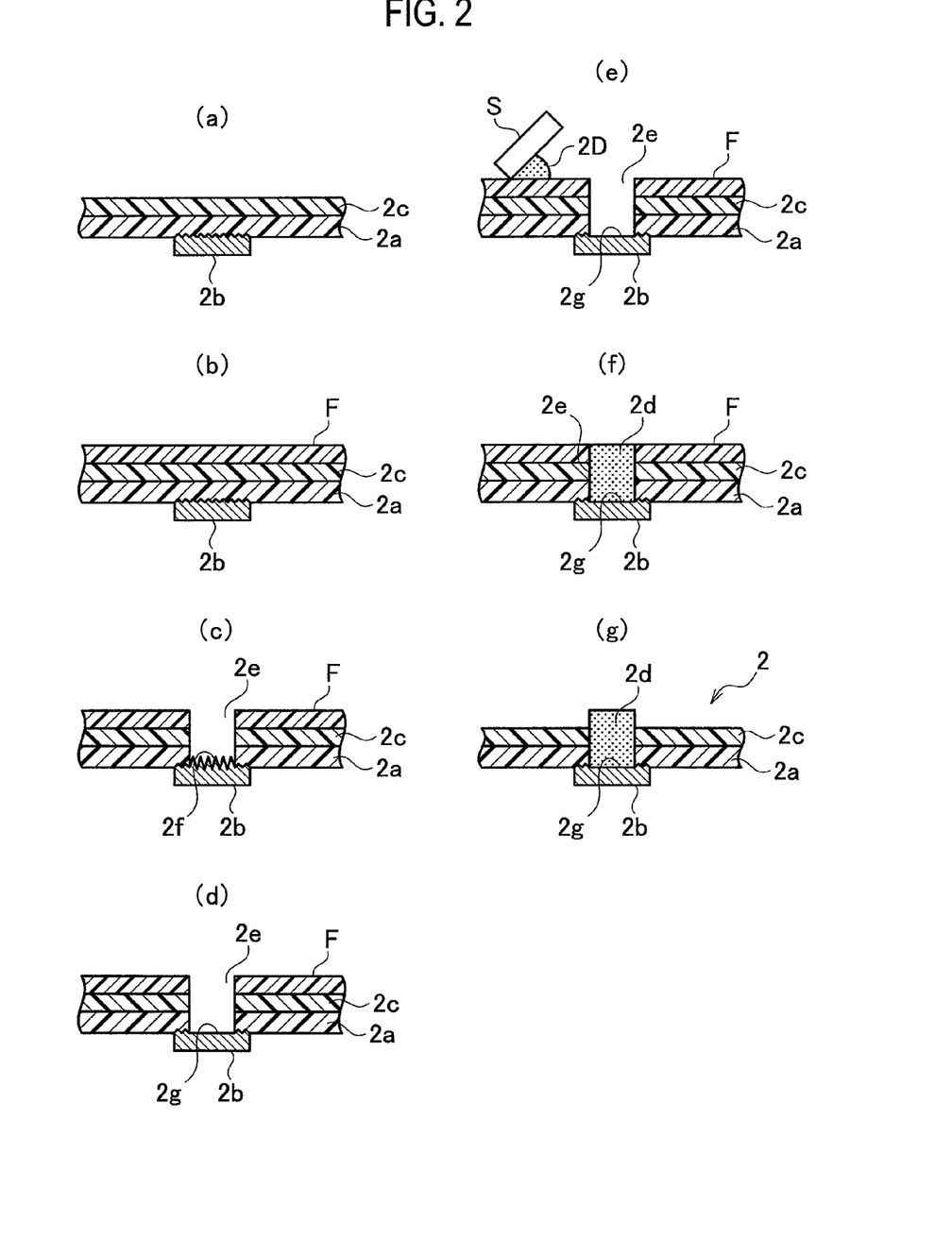
FIGS. 2(a) to 2(g) are main part enlarged cross-sectional views showing steps of a method for manufacturing the wiring board bases in FIG. 1 according to the embodiment of the present invention.

With reference to FIGS. 1 and 2, description will be given below of an embodiment of a laminated wiring board and a method for manufacturing the same according to the present invention. FIG. 1 is a schematic cross-sectional view for explaining a method for manufacturing the laminated wiring board by laminating a plurality of wiring board bases. FIG. 1(a) shows each of the wiring board bases before assembly. FIG. 1(b) shows a structure of the laminated wiring board after assembly. FIGS. 2(a) to 2(g) are main part enlarged cross-sectional views showing steps of a method for manufacturing each of the wiring board bases in FIG. 1.

First, as shown in FIG. 1(a), the plurality of wiring board bases, more specifically, first to fourth wiring board bases 1 to 4 vertically adjacent to each other are arranged so as to be stacked on each other. A first wiring board base 1 includes: a first insulating substrate 1a made of, for example, a polyimide resin film; a plurality of first conductive layers 1b which is made of, for example, copper foil for wiring and which is patterned on one surface (upper surface, first surface) of the first insulating substrate 1a; and a first adhesive layer 1c attached to the entire area of the other surface (lower surface, second surface) of the first insulating substrate 1a.

Considering the laminated wiring board shown in FIG. 1 as one unit, the first wiring board base 1 makes up a lowermost layer of the unit. Thus, the first adhesive layer 1c can be provided as needed. Specifically, when it is wished to attach the laminated wiring board to a predetermined member of an electronic device or another wiring board such as for example a core wiring board, it is more convenient to provide the first adhesive layer 1c. On the other hand, when there is no such need, the first adhesive layer 1c may be omitted. Moreover, although, in FIG. 1, a conductive via made of a conductive paste is not provided in the first wiring board base 1, the conductive via may be provided as needed.

A second wiring board base 2 includes: a second insulating substrate 2a made of, for example, a polyimide resin film; a plurality of second conductive layers 2b which is made of, for example, copper foil for wiring and which is patterned on one surface (upper surface, first surface) of the second insulating substrate 2a; a second adhesive layer 2c attached to the entire area of the other surface (lower surface, second surface) of the second insulating substrate 2a; and a plurality of conductive vias (through electrodes) 2d provided so as to correspond to the second conductive layers 2b, respectively.

Each of the conductive vias 2d is made of a columnar conductive paste filled in a through-hole 2e formed in a portion corresponding to each of the vias in the second insulating substrate 2a. As to each of the conductive vias 2d, one end (upper end surface) thereof is connected to an inner surface of a second conductive layer 2b and the other end (lower end surface) thereof is formed so as to protrude from a lower surface of the second adhesive layer 2c. Moreover, the second wiring board base 2 is disposed on the first wiring board base 1 so as to face the first wiring board base 1 while being positioned in such a manner that protrusion ends of the conductive vias 2d overlap the first conductive layers 1b in the first wiring board base 1, respectively.

A third wiring board base 3 includes: a third insulating substrate 3a; a plurality of third conductive layers 3b for wiring, patterned on one surface of the third insulating substrate 3a; a third adhesive layer 3c attached to the other surface of the third insulating substrate 3a; and a plurality of conductive vias 3d and through-holes 3e provided so as to correspond to the third conductive layers 3b, respectively.

Similarly, a fourth wiring board base 4 includes: a fourth insulating substrate 4a; a plurality of fourth conductive layers 4b for wiring, patterned on one surface of the fourth insulating substrate 4a; a fourth adhesive layer 4c attached to the other surface of the fourth insulating substrate 4a; and a plurality of conductive vias 4d and through-holes 4e provided so as to correspond to the fourth conductive layers 4b, respectively. For the respective parts making up the third and fourth wiring board bases 3 and 4, the same materials as those of the corresponding parts in the second wiring board base 2 are used.

Incidentally, the first to fourth wiring board bases 1 to 4 are shown as if the first to fourth conductive layers 1b to 4b have the same wiring pattern. However, to meet the requirements of a circuit wiring configuration of the laminated wiring board, the conductive layers are designed to have various wiring patterns such as the same pattern or patterns different from each other. Moreover, the conductive vias 2d to 4d in the second to fourth wiring board bases 2 to 4 are shown in the same number and in a stacked configuration. However, the number of the conductive vias can be arbitrarily selected for each of the wiring board bases. Moreover, the conductive vias 2d to 4d can employ various configurations such as the case where the vias are stacked on each other and the case where the vias are not stacked on each other.

After the first to fourth wiring board bases 1 to 4 vertically adjacent to each other are stacked on each other in such a manner that the protrusion ends of the conductive vias in one of the wiring board bases are aligned and overlap with the corresponding conductive layers in the other wiring board base, such a laminated body is hot-pressed collectively from both upper and lower sides. Thus, a laminated wiring board 10 as shown in FIG. 1(b) is manufactured.

The collective hot press described above is performed by mounting the laminated body on, for example, a vacuum cure pressing machine and then heating and pressure bonding the laminated body in a reduced-pressure atmosphere of 1 kPa or less. During the press, the adjacent wiring board bases are attached and fixed to each other by thermally curing the adhesive layers 1c to 4c. At the same time, the conductive pastes of the conductive vias 2d to 4d are thermally cured in a state of being crushed and firmly connected to the corresponding conductive layers 1b to 3b.

Moreover, the conductive paste for each of the conductive vias 2d to 4d contains: as a first metal component, at least one kind of metal particles selected from the group consisting of nickel, iron, aluminum, gold, silver and copper, having low electrical resistance and good heat-conducting properties; and, as a second metal component, at least one kind of low-melting-point metal particles selected from the group consisting of tin, bismuth, indium, zinc, antimony and lead. Moreover, in the conductive paste, a binder component consisting mainly of epoxy resin is mixed. Such a conductive paste is a conductive material in an uncured or partially cured soft state at normal temperature, which is thermally cured by heat treatment such as in the hot press process, for example, and performs an attachment function.

Furthermore, when the conductive layers 2b to 4b are made of copper or a material consisting mainly of copper as described above, the conductive paste preferably contains a low-melting-point metal component (particles) that is easily diffused in copper or a material mainly containing copper, such as tin or any of indium, zinc and antimony with tin as a main component. In this case, as an amount of the low-melting-point metal is increased, an amount of alloy layer formed at an interface between each of the conductive layers 2b to 4b and a corresponding one of the conductive vias 2d to 4d can be increased during the hot press. This leads to an advantage that adhesive strength is further improved and electrical reliability is enhanced.

Next, with reference to FIG. 2, description will be given of an embodiment of a method for manufacturing the wiring board base having the conductive vias according to the present invention. Since the second to fourth wiring board bases 2 to 4 can be manufactured by use of the same method, a method for manufacturing the second wiring board base 2 will be mainly described here. FIG. 2 is an enlarged cross-sectional view of a portion around one of the conductive vias, which is a main part of the second wiring board base 2. The second wiring board base 2 is shown reversed from that of FIG. 1.

Note that, in this embodiment, a single-sided copper-clad laminate (CCL) is used as an example of a starting board base of each of the first to fourth wiring board bases 1 to 4. Specifically, in the single-sided copper-clad laminate, a copper foil having a thickness of 12 µm, which is a conductive layer material, is attached to the entire surface on one side of a flexible insulating substrate made of a polyimide resin film having a thickness of 20 µm. Moreover, as the conductive paste, a material consisting mainly of metal components of copper and tin is used.

First, as shown in FIG. 2(a), the second conductive layer 2b for wiring having a desired circuit pattern is formed on one surface of the second insulating substrate 2a. This circuit pattern is obtained by forming an etching resist pattern (etching mask) corresponding to the circuit pattern on a surface of the copper foil by photolithography and then chemically etching the copper foil. Note that, for the etching, an etchant mainly composed of, for example, ferric chloride is used.

Incidentally, as to a surface of the single-sided copper-clad laminate (CCL) for which a commercially-available electrolytic foil is used and which is to be used as the starting base of the wiring board base, the surface coming into contact with the insulating substrate, an arithmetic mean roughness Ra (Japanese Industrial Standards: JIS B0601:2001) thereof is generally about 2 µm. Therefore, the surface can be treated as a rough surface from the micro viewpoint. FIG. 2 represents the rough surface configuration with exaggeration.

Moreover, the second adhesive layer 2c made of, for example, a thermosetting epoxy-resin-film adhesive material having a thickness of 25 µm is attached to the other surface of the second insulating substrate 2a. For the second adhesive layer 2c, an acrylic resin adhesive material or a thermoplastic adhesive material may be used. Moreover, the second adhesive layer 2c may be formed by applying a varnish resin adhesive, for example, onto the surface of the second insulating substrate 2a.

Thereafter, as shown in FIG. 2(b), a resin film F which is made of polyimide resin having a thickness of 25 µm, for example, and which is attached to a surface of the second adhesive layer 2c. For the resin film F, a plastic film such as PET and PEN may be used instead of polyimide. Alternatively, a film attachable and detachable by UV irradiation may be deposited and formed on the surface of the second adhesive layer 2c.

Next, as shown in FIG. 2(c), the through-hole 2e is formed, which penetrates the second insulating substrate 2a, the second adhesive layer 2c and the resin film F. The through-hole 2e is formed by laser processing of irradiating a laser beam using, for example, a YAG laser, a carbon dioxide laser, an excimer laser or the like from the resin film F side toward the second conductive layer 2b. In this event, the through-hole 2e serves as a via hole with a bottom having a diameter of, for example, 100 µm. Moreover, in this event, an internal surface of the second conductive layer 2b in the via hole, in other words, a via bottom surface is exposed inside the through-hole 2e.

The laser processing sufficiently exposes the via bottom surface inside the through-hole 2e. In this event, a surface rough portion 2f may be generated on the internal surface (via bottom surface) of the second conductive layer 2b, the portion 2f having large unevenness which causes the arithmetic mean roughness Ra to be 3 µm or more. This surface rough portion 2f may have unevenness 1.5 times larger than the surface roughness of a portion, coming into contact with the insulating substrate, of the copper foil.

Moreover, after the through-hole 2e is formed, a desmear process is performed. As the desmear process, for example, a plasma desmear process using $CF_4$ and $O_2$ mixed gas or inert gas such as Ar or a wet desmear process can be adopted.

Next, as shown in FIG. 2(d), the surface rough portion 2f is smoothed to form a smooth surface portion 2g. It is preferable that an arithmetic mean roughness Ra of a surface of the smooth surface portion 2g is 1 µm or less or a maximum height roughness Rz (Japanese Industrial Standards: JIS B0601:2001) thereof is 3 µm or less. Regarding an optimum value of the arithmetic mean roughness Ra or the maximum height roughness Rz, detailed description will be given with reference to Tables 1 to 3 and FIG. 3 to be described later.

As a method for smoothing the surface rough portion 2f so that the arithmetic mean roughness Ra of the smooth surface portion 2g may be 1 µm or less (or the maximum height roughness Rz to be 3 µm or less), chemical wet etching can be adopted, for example. To be more specific, the chemical wet etching is a method for smoothing the surface rough portion 2f on the inner surface of the second conductive layer 2b by dissolving the rough portion 2f with at least one kind of chemical etchant selected from the group consisting of, for example, hydrolyzed sulfate, sulfuric acid, hydrochloric acid, a ferric chloride solution and a copper chloride solution. By use of the above method, the smooth surface portion 2g formed of a smooth surface having the arithmetic mean roughness Ra of 1 µm or less can be accurately and easily formed.

Moreover, as another method for the smoothing, any of the following methods can be adopted: a sand blast method for smoothing the surface rough portion 2f by allowing abrasive grains to collide against the surface rough portion 2f; a laser abrasion method for smoothing the surface rough portion 2f by evaporating the surface rough portion 2f with a laser; and a plasma dry etching method for smoothing the surface rough portion 2f by physically etching the surface rough portion 2f in a plasma gas atmosphere.

Here, each of the above methods for the smoothing will be described in more detail.

1. Chemical Wet Etching Method

As an example, adopted is a method for dissolving the copper of the conductive layer 2b in copper sulfate by using sulfuric acid and a hydrogen peroxide solution. This method has an advantage that the method is low in cost because of a general process liquid used, an etching amount (rate) is easily adjusted by managing a concentration, a temperature and the like, and the inner surface of the conductive layer 2b can be easily smoothed. The chemical wet etching method is the most preferable method among the other methods to be described later.

2. Sand Blast Method

The inner surface of the conductive layer 2b is smoothed by irradiating or blasting the inner surface of the conductive layer directly with the abrasive grains or with a mixture (abrasive) of abrasive grains and water. This method is a physical polishing process and has an advantage of having less ion contamination after the process since there is no chemical reaction with the base.

3. Laser Abrasion Method

The inner surface of the conductive layer is smoothed by irradiating the inner surface of the conductive layer that is a target with a laser beam having a high energy density, causing a locally drastic increase in temperature in the irradiated portion and thus liquefying or gasifying the portion. This method has an advantage that a smoothing shape of the inner surface of the conductive layer 2b can be easily adjusted by adjusting laser energy (frequency or strength).

4. Plasma Dry Etching Method

The smoothing is performed by irradiating the inner surface of the conductive layer with plasma gas such as Ar and thus polishing the inner surface. This method has an advantage of being capable of performing much minuter and finer smoothing compared with the sand blast method using the abrasive grains.

Next, as shown in FIG. 2(e), screen printing is performed by squeegeeing a conductive paste 2D supplied onto an upper surface of a resin film F along the upper surface with a squeegee S. Thus, as shown in FIG. 2(f), a space inside the through-hole 2e is filled with the conductive paste to form the conductive via (through electrode) 2d.

Thereafter, as shown in FIG. 2(g), when the resin film F is removed, an upper end portion of the conductive via 2d is exposed in a state of protruding on the upper surface side of the adhesive layer 2c by a height corresponding to a thickness of the resin film F. Specifically, the resin film F is a mask film capable of adjusting a protrusion height of the conductive via 2d by selecting its thickness from a variety of thicknesses.

The second wiring board base 2 is thus completed through the above manufacturing steps. Moreover, the third and fourth wiring board bases 3 and 4 are manufactured by use of the same materials and method as those used for the second wiring board base 2 except that the pattern of the wiring conductive layer, the number of conductive vias and arrangement thereof may be set different from those in the second wiring board base 2.

In the description of this embodiment, since the first wiring board base 1 has no conductive vias, manufacture thereof is completed by the step of patterning a conductive layer 1b shown in FIG. 2(a). The first to fourth wiring board bases 1 to 4 thus manufactured are arranged as shown in FIG. 1(a), and the processing advances to the step of assembling the laminated wiring board 10 as described above.

According to the structure and manufacturing method of the wiring board base with the conductive vias described in the embodiment of the present invention, the smoothing as shown in FIG. 2(d) is performed after the desmear process compared with the conventional case where the conductive paste is filled without smoothing after formation of a through-hole and a desmear process. Thus, the surface rough portion 2f on the second conductive layer 2b, the surface rough portion 2f being caused in the formation of the through-hole 2e, is eliminated and the smooth surface portion 2g is formed. Thereafter, the conductive paste is filled in the through-hole 2e in a state of being in pressure contact with the smooth surface portion 2g to form the conductive via 2d as shown in FIG. 2(f).

Thus, even when various resistance tests such as a thermal shock test as described above are conducted, a crack failure and the like attributable to surface unevenness on the conductive layer, which have caused a problem in the conventional technology, can be prevented. Thus, the shape and conductivity at the time of manufacture of the conductive layers 2b to 4b are maintained. Moreover, connection reliability between the conductive layers 2b to 4b and the corresponding conductive vias 2d to 4d is improved.

Moreover, since the inner surface of the second conductive layer 2b has the smooth surface portion 2g, a lower end portion of the conductive via (through electrode) 2d is pressure-connected to the smooth surface portion 2g in a state where the conductive metal particles in the paste are evenly distributed regardless of the particle diameter thereof. Furthermore, the pressure-connected portion is more firmly connected and fixed by thermally curing the paste in a pressurized state by the collective hot press shown in FIG. 1(b).

Furthermore, when the metal particles consisting or mainly consisting of tin easily diffused in the second conductive layer 2b made of the copper foil are contained in the conductive paste as described above, a smooth alloy layer is uniformly and surely formed at a connection interface between the smooth surface portion 2g and each of the conductive vias 2d during the hot press. Thus, the connection strength is increased and connection resistance can be further reduced.

Figure 3:
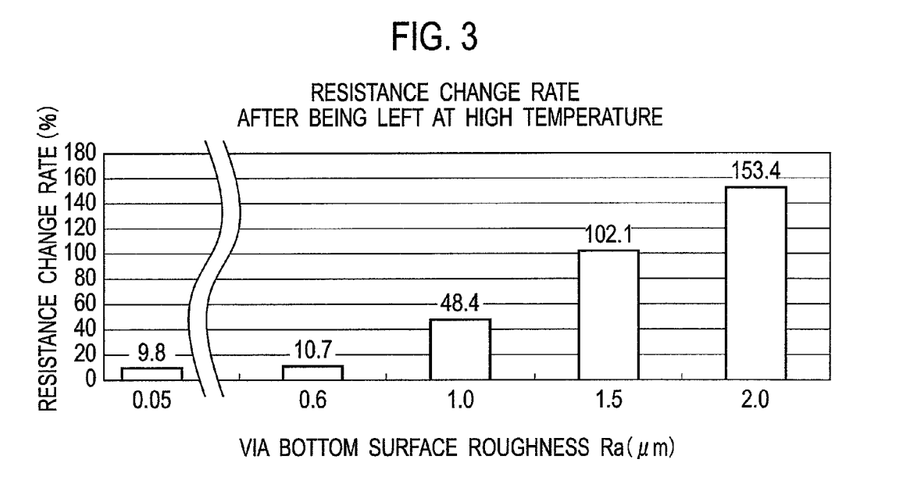
FIG. 3 is a characteristic diagram showing Table 2 as a graph, Table 2 representing a resistance change rate of the laminated wiring board after being left at a high temperature according to the embodiment of the present invention.

Next, a first high-temperature shelf test is conducted on the laminated wiring board manufactured by the method according to the embodiment of the present invention described above. Tables 1, 2 and FIG. 3 show results of measurement of connection reliability. In the high-temperature shelf test, a moisture absorption reflow test is conducted on each sample under JEDEC MSL level 3 and then the sample is left at 175° C. for 100 hours. For both the conventional technology and the present invention, the test is conducted by using 400 conductive vias as samples. As a result, an average value (mΩ), a standard deviation value and a resistance change rate (%) of connection resistance are measured.

First, Table 1 will be described. The section of the present invention in Table 1 shows test results before and after the high-temperature shelf test when the arithmetic mean roughness Ra of the surface of each smooth surface portion of the conductive layer (2b to 4b) is set to 0.6 µm by smoothing. Moreover, the section of the conventional technology in Table 1 shows test results before and after the high-temperature shelf test in the case of using the technology as disclosed in Patent Document 2 in which no smoothing is performed.

TABLE 1

RESISTANCE VALUE OF CONNECTION PORTION AND RESISTANCE CHANGE RATE BEFORE AND AFTER TEST

|  | CONVENTIONAL TECHNOLOGY (Ra = 2.0 µm) | | PRESENT INVENTION (Ra = 0.6 µm) | |
| --- | --- | --- | --- | --- |
|  | BEFORE TEST | AFTER TEST | BEFORE TEST | AFTER TEST |
| AVERAGE VALUE (mΩ) | 2.76 | 6.98 | 2.42 | 2.68 |
| STANDARD DEVIATION VALUE (mΩ) | 4.81 | 7.87 | 0.256 | 0.393 |
| RESISTANCE CHANGE RATE (%) | 152.9 | | 10.7 | |

In the test results, focusing attention on the connection resistance average value (mΩ) of the connection portion between the conductive layer and the conductive via in the through-hole, the connection resistance after the high-temperature shelf test in the conventional technology is significantly increased to 6.98 mΩ, which is 2.5 times higher than that before the test.

On the other hand, in the present invention, the connection resistances before and after the high-temperature shelf test are as low as 2.42 mΩ and 2.68 mΩ, respectively. A change between before and after the test is small and, particularly, the connection resistance after the test in the present invention is much smaller than that in the conventional technology. Thus, it is understood that the wiring board base according to the present invention has a high connection reliability.

As to the standard deviation value, in the conventional technology, the connection resistance varies widely regardless of before and after the test and is significantly changed from 4.81 mΩ before the test to 7.87 mΩ after the test. On the other hand, in the present invention, a variation in the connection resistance is smaller than that in the conventional technology by one digit or less regardless of before and after the test. Moreover, a change in the connection resistance is also small, which is from 0.256 mΩ before the test to 0.393 mΩ after the test.

Furthermore, as to also the resistance change rate between before and after the test, the resistance change rate is significantly changed to 152.9% in the conventional technology. On the other hand, in the present invention, the resistance change rate is as very small as 10.7%. Specifically, the present invention can stably achieve wiring board bases having high connection reliability and uniform quality and thus can provide a high-performance and high-quality laminated wiring board.

Meanwhile, Table 2 shows results obtained by measuring resistance change rates (%) before and after a high-temperature shelf test on the connection portion between the conductive layer and the conductive via for five kinds of samples in which the arithmetic mean roughness Ra of the surface of each smooth surface portion of the conductive layer (2b to 4b), in other words, of the via bottom surface is set to 0.05 µm, 0.6 µm, 1.0 µm, 1.5 µm and 2.0 µm by smoothing. Moreover, FIG. 3 shows a graph regarding the resistance change rates corresponding to Table 2. Note that the arithmetic mean roughness Ra of the via bottom surface is measured by use of a confocal laser scanning microscope.

TABLE 2

RESISTANCE CHANGE RATES BEFORE AND AFTER BEING LEFT AT HIGH TEMPERATURE

| ROUGHNESS Ra OF VIA BOTTOM SURFACE (μm) | RESISTANCE CHANGE RATE (%) |
|---|---|
| 0.05 | 9.8 |
| 0.6 | 10.7 |
| 1.0 | 48.4 |
| 1.5 | 102.1 |
| 2.0 | 153.4 |

As shown in Table 2 and FIG. 3, the sample having the Ra of 0.6 μm has a resistance change rate of 10.7% as already shown in Table 1. In the case of the samples having the Ra of 1.0 μm, 1.5 μm and 2.0 μm, resistance change rates corresponding thereto are 48.4%, 102.1% and 153.4%, respectively. Moreover, regarding the wiring board base and laminated wiring board having a high connection reliability, the resistance change rate is preferably 50% or less from a practical viewpoint to surely maintain and stably provide the reliability in the market over a long period of time. Thus, it is preferable to set the arithmetic mean roughness Ra of the via bottom surface to 1 μm or less. Furthermore, to maintain productivity related to a smoothing time at a satisfactory level, it is preferable to set the Ra to 0.05 μm or more. In this case, the resistance change rate is suppressed as low as 9.8% and thus satisfactory reliability can also be achieved. Therefore, it can be concluded that a more preferable range of the Ra in the present invention is 0.05 μm to 1 μm.

Figure 4:
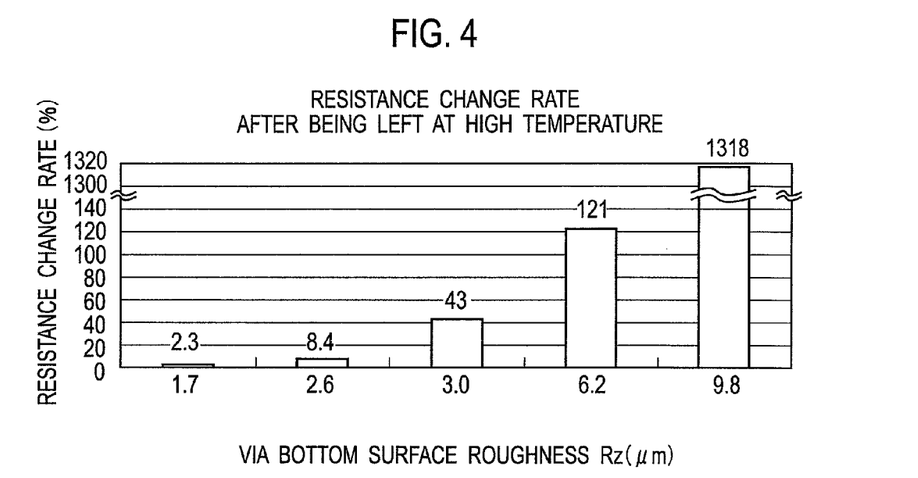
FIG. 4 is a characteristic diagram showing Table 3 as a graph, Table 3 representing a resistance change rate of the laminated wiring board after being left at a high temperature according to the embodiment of the present invention.

Moreover, a second high-temperature shelf test is conducted on five kinds of samples newly prepared under the same conditions. Table 3 shows results of measurement of connection reliability and FIG. 4 shows a graph of Table 3. In this high-temperature shelf test, a moisture absorption reflow test is conducted on each sample under JEDEC MSL level 3 and then the sample is left at 125° C. for 1000 hours. Also in this case, the test is conducted by using 400 conductive vias as samples, and an average value (mΩ), a standard deviation value and a resistance change rate (%) of connection resistance are measured. Table 3 shows results obtained by measuring resistance change rates (%) before and after the high-temperature shelf test on the connection portion between the conductive layer and the conductive via for five kinds of samples in which the maximum height roughness Rz of the surface of each smooth surface portion of the conductive layer (2b to 4b), in other words, of the via bottom surface is set to 1.7 μm, 2.6 μm, 3.0 μm, 6.2 μm and 9.8 μm by smoothing.

TABLE 3

RESISTANCE CHANGE RATES BEFORE AND AFTER BEING LEFT AT HIGH TEMPERATURE

| ROUGHNESS Rz OF VIA BOTTOM SURFACE (μm) | RESISTANCE CHANGE RATE (%) |
|---|---|
| 1.7 | 2.3 |
| 2.6 | 8.4 |
| 3.0 | 43 |
| 6.2 | 121 |
| 9.8 | 1318 |

As shown in Table 3 and FIG. 4, in the second high-temperature shelf test, the sample having the maximum height roughness Rz of 1.7 μm has a resistance change rate of 2.3%. Similarly, in the case of the samples having the Rz of 2.6 μm, 3.0 μm, 6.2 μm and 9.8 μm, resistance change rates corresponding thereto are 8.4%, 43%, 121% and 1318%, respectively.

As described above about the results of the first high-temperature shelf test, regarding the wiring board base and laminated wiring board having a high connection reliability, the resistance change rate is preferably 50% or less to surely maintain and stably provide the reliability in the market over a long period of time. Therefore, according to the test result, it is preferable to set the maximum height roughness Rz of the via bottom surface to 3.0 μm or less. Furthermore, to maintain productivity related to a smoothing time at a satisfactory level, it is preferable to set the maximum height roughness Rz to 1.7 μm or more. In this case, the resistance change rate is suppressed as low as 2.3% and thus satisfactory reliability can also be achieved. Therefore, it can be concluded that a preferable range of the maximum height roughness Rz in the present invention is 1.7 μm to 3.0 μm.

Note that a cross-section observation of the interface between the conductive layer and the via portion finds out an alloy layer of $Cu_3Sn$ or $Cu_6Sn_5$. Moreover, regarding a thickness of the alloy layer, it is confirmed that the thickness is in a range of 0.5 to 2.0 μm in the sample having the arithmetic mean roughness Ra=0.05 to 1.0 μm and the sample having the maximum height roughness Rz=1.7 to 3.0 μm while the thickness is small in the sample without smoothing.

As described above, in the case of manufacturing the laminated wiring board by use of the wiring board base according to the embodiment of the present invention, the second to fourth wiring board bases 2 to 4 can be easily obtained by using a so-called single-sided CCL having a copper foil provided on one side of an insulating substrate, providing a through-hole in the insulating substrate and printing and filling a conductive paste in the through-hole to form the conductive vias 2d to 4d.

After sequentially stacking the second to fourth wiring board bases 2 to 4 on the first wiring board base 1 using the CCL as a base, the wiring board bases are collectively hot-pressed. Thus, a laminated wiring board can be easily manufactured. Therefore, compared with the conventional built-up method (see Patent Document 1), the manufacturing method according to the embodiment of the present invention can significantly reduce production time and production cost by eliminating a plating step and can also significantly reduce a thermal history on the wiring board base and deterioration of the base throughout the manufacturing process.

Furthermore, by setting the via bottom surface roughness Ra to 0.6 μm or less or setting the maximum height roughness Rz to 3.0 μm or less and by using the conductive paste containing low-melting-point metal, an optimum alloy layer can be obtained and thus good reliability can be achieved.

As to the case where surface roughness occurs in the surface, in the through-hole, of the conductive layer by laser processing in the step of FIG. 2(c) in the embodiment of the present invention, the description was given of the example where the smoothing is performed in the step of FIG. 2(d). However, the present invention is not limited to such a case. For example, there is a case where previously roughened copper foils are prepared according to a wiring board base product or manufacturing purposes, a through-hole is provided in an insulating substrate and then the copper foils are attached to each other so as to cover the through-hole. In such a case, by smoothing the copper foil surface in the through-hole, the same effect can be achieved.

Moreover, although, in the embodiment described above, the first wiring board base 1 is formed of a so-called FPC using a flexible material as an insulating substrate, the wiring board base may be formed of a so-called RPC using; for example, a glass epoxy resin as an insulating substrate. Instead of the first wiring board base 1, a single-layer or multilayer core wiring board may be used. In formation of the laminated wiring board 10 by stacking the wiring board bases on the first wiring board base 1, the core wiring board or the like, not all the second to fourth wiring board bases 2 to 4 always have to be stacked. In this event, at least one wiring board base with conductive vias may be stacked.

Furthermore, at least one of the insulating substrates of the first to fourth wiring board bases 1 to 4 may be formed of an insulating substrate obtained by impregnating, for example, glass fibers with a resin adhesive. In such a case, it is not required to attach adhesive layers such as the adhesive layers 1c to 4c.

Moreover, the present invention can also be applied to the case where the wiring board base with conductive vias is formed of a so-called RPC using a rigid insulating substrate such as a glass epoxy resin.

Figure 5:
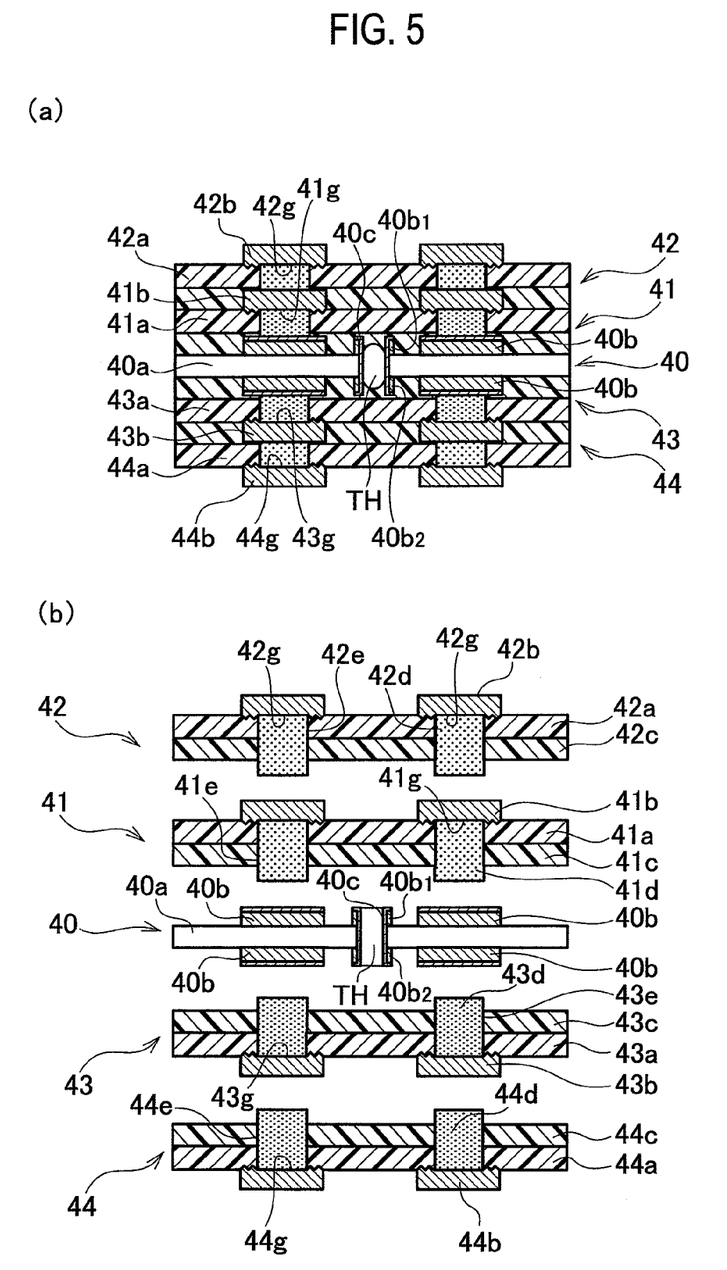
FIGS. 5(a) and 5(b) are cross-sectional views of a laminated wiring board according to another embodiment of the present invention, FIG. 5(a) showing a cross-sectional view of the laminated wiring board after assembly and FIG. 5(b) showing an exploded cross-sectional view of the laminated wiring board.

Next, with reference to FIG. 5, description will be given of another embodiment using the laminated wiring board of the present invention. FIG. 5(a) shows a cross-section structure of a laminated wiring board completed after assembly and FIG. 5(b) is an exploded cross-sectional view thereof. Specifically, a core wiring board base 40 positioned in the center in a vertical direction of FIG. 5 is formed by using, for example, a double-sided copper-clad laminate (double-sided CCL) as a starting base thereof. The core wiring board base 40 is an insulating substrate 40a made of, for example, a glass epoxy resin, a polyimide resin or the like. A circuit pattern is formed on copper layers provided on both surfaces of the insulating substrate 40a by chemical mask etching or the like. As a result, wiring conductive layers 40b, 40b1 and 40b2 are formed on the both surfaces of the insulating substrate 40a.

Thereafter, as shown in the center portion in a horizontal direction of FIG. 5, a through-hole TH penetrating an overlapping portion of an upper conductive layer 40b1, the insulating substrate 40a and a lower conductive layer 40b2 is formed by use of a drill or a laser, for example. By applying copper plating over an inner surface of the through-hole TH and surfaces of the both conductive layers 40b1 and 40b2, a through-hole-shaped interlayer conductive via 40c is formed. Here, the copper plating is applied to the entire surfaces of the respective conductive layers 40b, 40b1 and 40b2. However, the copper plating can also be applied only to a portion corresponding to the interlayer conductive via 40c by masking.

Thereafter, first and second wiring board bases 41 and 42 are sequentially stacked above the core wiring board base 40 and, similarly, third and fourth wiring board bases 43 and 44 are sequentially stacked therebelow. Thus, a laminated wiring board has a laminated structure vertically symmetrical about the core wiring board base 40. All of the first to fourth wiring board bases (41 to 44) have corresponding insulating substrates (41a to 44a), conductive layers (41b to 44b), adhesive layers (41c to 44c), through-holes (41e to 44e) and conductive vias (41d to 44d). Moreover, on inner surfaces of the conductive layers (41b to 44b), the surfaces coming into contact with the conductive vias (41d to 44d), smooth surface portions (41g to 44g) are formed by smoothing.

Moreover, the first to fourth wiring board bases 41 to 44 are manufactured by use of the same bases and method as those used for the first to fourth wiring board bases 1 to 4 according to the embodiment shown in FIGS. 1 and 2. Subsequently, the core wiring board base 40 and the first to fourth wiring board bases 41 to 44 are aligned and stacked with each other as shown in FIG. 5(b). Thereafter, collective hot press is performed by mounting the laminated body on a vacuum cure pressing machine as described above. Thus, a laminated wiring board having a vertically symmetrical structure as shown in FIG. 5(a) is assembled.

The laminated wiring board according to the another embodiment as described above can connect circuits in the first and second upper wiring board bases 41 and 42 to circuits in the third and fourth lower wiring board bases 43 and 44 through the through-hole-shaped interlayer conductive via 40c in the core wiring board base 40. Moreover, since the smooth surface portions (41g to 44g) are formed on the inner surfaces of the conductive layers (41b to 44b) by smoothing, a high connection reliability can be achieved even in various resistance tests such as a thermal shock test.

Figure 6:
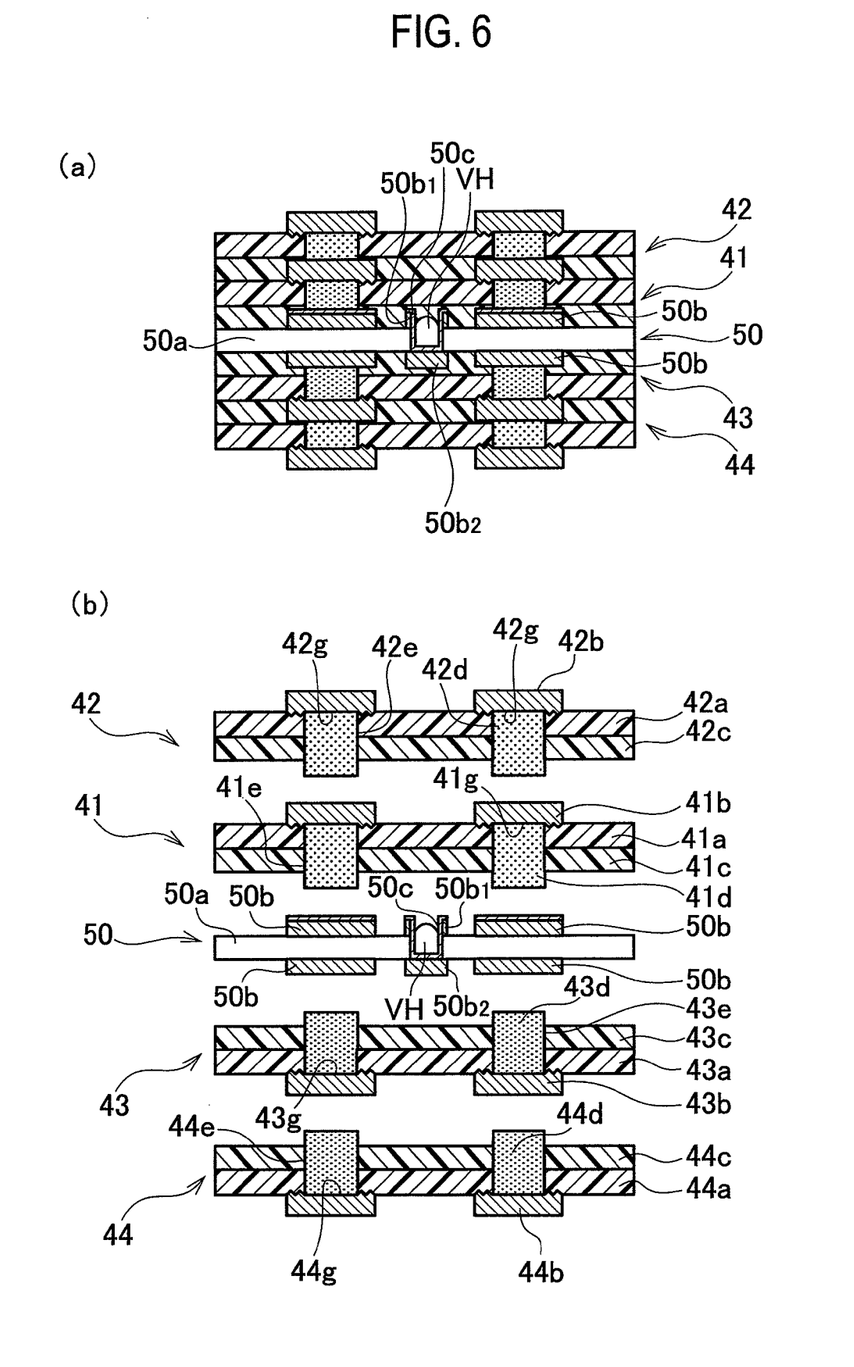
FIGS. 6(a) and 6(b) are cross-sectional views of a laminated wiring board according to still another embodiment of the present invention, FIG. 6(a) showing a cross-sectional view of the laminated wiring board after assembly and FIG. 6(b) showing an exploded cross-sectional view of the laminated wiring board.

Next, with reference to FIG. 6, description will be given of still another embodiment of a laminated wiring board according to the present invention. FIG. 6(a) shows a cross-section structure of a laminated wiring board completed after assembly and FIG. 6(b) is an exploded cross-sectional view thereof. Moreover, the same constituent members as those in the embodiment shown in FIG. 5 are denoted by the same reference numerals and characteristic components will be described while omitting description of the same members. Specifically, a core wiring board base 50 positioned in the center in a vertical direction of FIG. 6 is formed by using, for example, a double-sided copper-clad laminate (double-sided CCL) as a starting base thereof. The core wiring board base 50 is an insulating substrate 50a made of, for example, a glass epoxy resin, a polyimide resin or the like. A circuit pattern is formed on copper layers on both surfaces of the insulating substrate 50a by chemical mask etching or the like. As a result, wiring conductive layers 50b, 50b1 and 50b2 are formed on the both surfaces of the insulating substrate 50a.

Thereafter, as shown in the center portion in a horizontal direction of FIG. 6, a laser via hole (LVH) VH is formed by laser processing so as to penetrate an upper conductive layer 50b1 and the insulating substrate 50a. The via hole VH has its lower surface covered with a lower conductive layer 50b2 and has an upward opening shape with a bottom. Subsequently, by applying copper plating, for example, over an inner surface of the via hole VH, a surface of the upper conductive layer 50b1 and an inner surface of the hole VH in the lower conductive layer 50b2, a LVH-shaped interlayer conductive via 50c is formed. Here, the copper plating is simultaneously applied to the upper conductive layer 50b. However, the copper plating can also be applied only to a portion corresponding to the interlayer conductive via 50c by masking. Moreover, although copper plating for the lower conductive layers 50b and 50b2 is not performed in the example shown in FIG. 6, the copper plating may be arbitrarily performed as needed.

Subsequently, the first and second wiring board bases 41 and 42 and the third and fourth wiring board bases 43 and 44 are aligned and laminated with each other above and below the core wiring board base 50 as shown in FIG. 6(b). Thereafter, collective hot press is performed by mounting the laminated body on a vacuum cure pressing machine. Thus, a laminated wiring board having a vertically symmetrical laminated structure as shown in FIG. 6(a) is assembled.

In the laminated wiring board according to the still another embodiment as described above, circuits in the first and second upper wiring board bases 41 and 42 are connected to circuits in the third and fourth lower wiring board bases 43 and 44 through the LVH-shaped interlayer conductive via 50c in the core wiring board base 50. Moreover, since the smooth surface portions (41g to 44g) are formed on the inner surfaces of the conductive layers (41b to 44b) by smoothing, high connection reliability between the conductive layers and the conductive vias can be achieved even in various resistance tests such as a thermal shock test.

INDUSTRIAL APPLICABILITY

In the laminated wiring board and the method for manufacturing the same according to the present invention, the surface portion, in the through-hole, of the conductive layer is smoothed. Therefore, high connection reliability between the conductive layer and the conductive via can be achieved even in various resistance tests such as a thermal shock test on the wiring board, for example.

The invention claimed is:

1. A laminated wiring board comprising:
at least one wiring board base including
an insulating substrate having a first surface and a second surface opposite to the first surface,
a conductive layer provided on the first surface, and
a conductive via including a through-hole reaching the conductive layer from the second surface and a conductive paste filled in the through-hole, the conductive paste including a metal component forming an alloy layer with the conductive layer at an interface therebetween,
wherein the conductive layer includes: a surface outside the through-hole, the surface contacting to the first surface of the insulating layer; and a smoothed portion contacting to the conductive via in the through-hole, the smoothed portion being smoother than the surface of the conductive layer contacting to the first surface of the insulating layer to increase a thickness of the alloy layer, and a maximum height roughness Rz of the smoothed portion is 3 µm or less.

2. The laminated wiring board according to claim 1, wherein a thickness of the alloy layer is 0.5 to 2.0 µm, and the alloy layer contains any of $Cu_3Sn$ and $Cu_6Sn_5$.

3. A method for manufacturing a laminated wiring board in which at least one wiring board base is stacked, comprising:
providing a conductive layer on a first surface of an insulating substrate included in the wiring board base;
providing a through-hole reaching the conductive layer from a second surface opposite to the first surface;
smoothing a surface portion, in the through-hole, of the conductive layer to increase a thickness of an alloy layer formed at an interface between the surface portion and a conductive paste, the conductive paste including a metal component forming the alloy layer with the conductive layer;
filling the through-hole with the conductive paste; and
forming a conductive via to be connected to the conductive layer together with the alloy layer by heating the conductive layer and the conductive paste.

4. The method for manufacturing a laminated wiring board, according to claim 3, wherein
the smoothing is performed in such a manner that an arithmetic mean roughness Ra of the surface portion, in the through-hole, of the conductive layer is 1.0 µm or less.

5. The method for manufacturing a laminated wiring board, according to claim 3, wherein
the smoothing is performed in such a manner that a maximum height roughness Rz of the surface portion, in the through-hole, of the conductive layer is 3 µm or less.

6. A laminated wiring board comprising:
at least one wiring board base including
an insulating substrate having a first surface and a second surface opposite to the first surface,
a conductive layer provided on the first surface, and
a conductive via including a through-hole reaching the conductive layer from the second surface and a conductive paste filled in the through-hole, the conductive paste including a metal component forming an alloy layer with the conductive layer at an interface therebetween,
wherein the conductive layer includes; a surface outside the through-hole, the surface contacting to the first surface of the insulating layer; and a smoothed portion contacting to the conductive via in the through-hole, the smoothed portion being smoother than the surface of the conductive layer contacting to the first surface of the insulating layer to increase a thickness of the alloy layer, and an arithmetic mean roughness Ra of the smoothed portion is 1.0 µm or less.

7. The laminated wiring board according to claim 6, wherein a thickness of the alloy layer is 0.5 to 2.0 µm, and the alloy layer contains any of $Cu_3Sn$ and $Cu_6Sn_5$.

* * * * *